US012587207B2

(12) United States Patent
Büchel et al.

(10) Patent No.: US 12,587,207 B2
(45) Date of Patent: Mar. 24, 2026

(54) ADAPTIVE DIGITAL-TO-ANALOG CONVERTER RANGE OPTIMIZATION

(71) Applicant: International Business Machines Corporation, Armonk, NY (US)

(72) Inventors: Julian Röttger Büchel, Zurich (CH); Corey Liam Lammie, Kilchberg (CH); Athanasios Vasilopoulos, Zurich (CH); Manuel Le Gallo-Bourdeau, Horgen (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 18/433,782

(22) Filed: Feb. 6, 2024

(65) Prior Publication Data

US 2025/0253862 A1     Aug. 7, 2025

(51) Int. Cl.
| | |
|---|---|
| *H03M 1/66* | (2006.01) |
| *G11C 11/54* | (2006.01) |
| *H03M 1/70* | (2006.01) |

(52) U.S. Cl.
CPC ............... *H03M 1/70* (2013.01); *G11C 11/54* (2013.01)

(58) Field of Classification Search
CPC .......... G06N 3/065; G06N 3/08; G06N 3/045; G06N 3/084; G06N 3/048; G06N 3/063;
(Continued)

(56) References Cited

U.S. PATENT DOCUMENTS

| | | | | | |
|---|---|---|---|---|---|
| 10,496,374 | B2 * | 12/2019 | Hu | ....................... | G11C 7/1006 |
| 11,404,106 | B2 * | 8/2022 | Papageorgiou | ...... | G06N 3/0442 |

(Continued)

FOREIGN PATENT DOCUMENTS

| | | |
|---|---|---|
| CN | 114496013 A | 5/2022 |
| WO | 2021083154 A1 | 5/2021 |

(Continued)

OTHER PUBLICATIONS

Doevenspeck et al., "OxRRAM-Based Analog in-Memory Computing for Deep Neural Network Inference: A Conductance Variability Study", IEEE Transactions on Electron Devices, vol. 68, No. 5, May 2021. 5 pages. https://ieeexplore.ieee.org/abstract/document/9405305.

(Continued)

*Primary Examiner* — Linh V Nguyen
(74) *Attorney, Agent, or Firm* — Scully, Scott, Murphy & Presser, P.C.; Kimberly S. Zillig

(57)     ABSTRACT

System and method for adaptively optimizing digital-to-analog converter input range values for improved signal-to-noise ratio for analog-in-memory computing (AIMC) systems. The method includes a step of tuning the input ranges of the digital-to-analog (DAC) converters of a "tile", comprised of Processing Elements (PEs) in a crossbar arrangement, to minimize the matrix-vector-multiplication (MVM) error under the presence of some residual noise term that is applied to the output of the MVM. Alternatively, the method includes tuning the input ranges of the DAC converters to minimize the accuracy of a predefined task, e.g., a classification task, under the presence of some residual noise term applied to the output of each matrix-vector-multiplication. The DAC input value range is optimized with respect to a metric that depends on a residual noise source present in AIMC systems. In an embodiment, the system minimizes the error introduced by the residual noise and the quantization.

20 Claims, 6 Drawing Sheets

(58) Field of Classification Search

CPC .......... G06N 3/04; G06N 3/0464; G06N 3/09; G06F 7/5443; G06F 17/16; G06F 3/0604; G06F 3/0659; G06F 3/0679; G06F 7/57; G06F 2207/4802; G06F 5/01; G06F 5/012; G06F 7/388; G06F 7/485; G06F 7/4876; G06F 7/575; H03M 1/12; H03M 1/38; H03M 1/66; H03M 1/742; G06G 7/186

USPC .................................. 341/118–121, 144, 139

See application file for complete search history.

(56) References Cited

U.S. PATENT DOCUMENTS

| | | | | |
|---|---|---|---|---|
| 11,637,561 B2 * | 4/2023 | Chao | ..................... | G06G 7/186 |
| | | | | 341/144 |
| 2019/0294416 A1 * | 9/2019 | Hu | ........................... | G11C 7/16 |
| 2020/0380349 A1 | 12/2020 | Rasch et al. | | |
| 2021/0383203 A1 * | 12/2021 | Kim | ...................... | G06N 3/065 |
| 2022/0158651 A1 * | 5/2022 | Chao | ..................... | H03M 1/742 |
| 2022/0180164 A1 | 6/2022 | Rasch | | |
| 2022/0188628 A1 * | 6/2022 | Rasch | .................... | G06N 3/063 |
| 2022/0277199 A1 * | 9/2022 | Gao | ......................... | G06N 3/08 |
| 2022/0318609 A1 | 10/2022 | Fick et al. | | |
| 2022/0391688 A1 | 12/2022 | Rasch | | |
| 2023/0097217 A1 | 3/2023 | Rasch et al. | | |
| 2024/0037380 A1 * | 2/2024 | Henderson | ............... | G06N 3/09 |
| 2024/0241691 A1 * | 7/2024 | Shin | ......................... | G06F 5/01 |
| 2025/0005431 A1 | 1/2025 | Lammie et al. | | |

FOREIGN PATENT DOCUMENTS

| | | |
|---|---|---|
| WO | 2021197562 A1 | 10/2021 |
| WO | 2025/169017 A1 | 8/2025 |

OTHER PUBLICATIONS

He et al., "Noise Injection Adaption: End-to-End ReRAM Crossbar Non-ideal Effect Adaption for Neural Network Mapping," 2019 56th ACM/IEEE Design Automation Conference (DAC), 2019. 6 pages. doi.org/10.1145/3316781.3317870.

Lammie et al., "Improving the Accuracy of Analog-Based In-Memory Computing Accelerators Post-Training", arXiv, Jan. 18, 2024, 5 pages, https://arxiv.org/abs/2401.09859.

Li et al, "Impact of analog memory device failure on in-memory computing inference accuracy", Submitted: Oct. 24, 2022• Accepted: Jan. 13, 2023• Published Online: Feb. 14, 2023, Cite as: APL Mach. Learn. 1, 016104 (2023), 9 pages. https://doi.org/10.1063/5.0131797.

Li et al, "Seizure Detection and Prediction by Parallel Memristive Convolutional Neural Networks," IEEE Transactions on Biomedical Circuits and Systems, vol. 16, No. 4, pp. 609-625, Aug. 2022. 17 pages. doi.org/10.1109/tbcas.2022.3185584.

Mackin et al,"Optimised weight programming for analogue memory-based deep neural networks," Nature Communications, vol. 13, No. 1, Jun. 2022. 12 pages. doi.org/10.1038/s41467-022-31405-1.

Mannocci et al, "In-memory computing with emerging memory devices: Status and outlook", Submitted: Nov. 25, 2022• Accepted: Jan. 24, 2023• Published Online: Feb. 14, 2023. Cite as: APL Mach. Learn. 1, 010902 (2023). 26 pages, https://doi.org/10.1063/5.0136403.

Mehonic et al, "Simulation of Inference Accuracy Using Realistic RRAM Devices," Frontiers in Neuroscience, vol. 13, Jun. 2019. 15 pages. doi.org/10.3389/fnins.2019.00593.

Noise and Bound Management, 14 pages, 2020, https://aihwkit.readthedocs.io/en/latest/api/aihwkit.simulator.configs.enums.html#aihwkit.simulator.configs.enums.NoiseManagementType.

Pedretti et al, "Conductance variations and their impact on the precision of in-memory computing with resistive switching memory (RRAM)", 2021 IEEE International Reliability Physics Symposium (IRPS) | 978-1-7281-6893-7/21/$31.00 @2021 IEEE | DOI: 10.1109/IRPS46558.2021.9405130. 8 pages, https://www.researchgate.net/publication/352637715_Conductance_variations_and_their_impact_on_the_precision_of_in-memory_computing_with_resistive_switching_memory_.

Rasch et al, "A Flexible and Fast PyTorch Toolkit for Simulating Training and Inference on Analog Crossbar Arrays," 2021 IEEE 3rd International Conference on Artificial Intelligence Circuits and Systems (AICAS), 2021. 11 pages. doi.org/10.1109/AICAS51828.2021.9458494.

Rasch et al., "Hardware-aware training for large-scale and diverse deep learning inference workloads using in-memory computing-based accelerators", tFeb 17, 2023. 35 pages. https://doi.org/10.48550/arXiv.2302.08469.

Spoon et al, "Toward Software-Equivalent Accuracy on Transformer-Based Deep Neural Networks With Analog Memory Devices," Frontiers in Computational Neuroscience, vol. 15, p. 675741, Jul. 2021. 9 pages. doi.org/10.3389/fncom.2021.675741.

Azghadi, M.R., et al., "Hardware Implementation of Deep Network Accelerators Towards Healthcare and Biomedical Applications", IEEE Transactions on Biomedical Circuits and Systems, Dec. 2020, pp. 1138-1159, vol. 14, No. 6.

Banner, R., et al., "Post Training 4-Bit Quantization of Convolutional Networks for Rapid-Deployment", 33rd International Conference on Neural Information Processing Systems (NeurIPS 2019), 2019, 9 pages.

Dong, Z, et al., "HAWQ: Hessian AWare Quantization of Neural Networks with Mixed-Precision", arXiv:1905.03696v1 [cs.CV], Apr. 29, 2019, 12 pages.

Fan, A., et al., 'Training with Quantization Noise for Extreme Model Compression', arXiv:2004.07320v3 [cs.LG], Feb. 28, 2021, 20 pages.

Huang, C.-T., et al., "Automated Quantization Range Mapping for DAC/ADC Non-linearity in Computing-In-Memory", Proceedings—IEEE International Symposium on Circuits and Systems, May 2022, pp. 2998-3002.

Hubara, I., et al., "Accurate Post Training Quantization With Small Calibration Sets", Proceedings of the 38th International Conference on Machine Learning, Jul. 18-24, 2021, pp. 4466-4475, vol. 139.

Jacob, B., et al., "Quantization and Training of Neural Networks for Efficient Integer-Arithmetic-Only Inference", arXiv:1712.05877v1 [cs.LG], Dec. 15, 2017, pp. 2704-2713.

Khaddam-Aljameh, R., et al., "HERMES-Core—A 1.59-TOPS/mm2 PCM on 14-nm CMOS In-Memory Compute Core Using 300-ps/LSB Linearized CCO-Based ADCs", IEEE Journal of Solid-State Circuits, Apr. 2022, pp. 1027-1038, vol. 57, No. 4.

Kirtas, M., et al., "Normalized Post-training Quantization for Photonic Neural Networks", IEEE Symposium Series on Computational Intelligence (SSCI), Dec. 4, 2022, pp. 657-663.

Krishnamoorthi, R., et al., "Quantizing deep convolutional networks for efficient inference: A whitepaper", arXiv:1806.08342v1 [cs.LG], Jun. 21, 2018, 36 pages.

Laubeuf, N., et al., "Dynamic Quantization Range Control for Analog-in-Memory Neural Networks Acceleration", ACM Transactions on Design Automation of Electronic Systems, 21 pages, vol. 27, Issue 5, Article No. 46.

Lee, J., et al., "Quantune: Post-training quantization of convolutional neural networks using extreme gradient boosting for fast deployment", arXiv:2202.05048v2 [cs.LG], Feb. 21, 2022, 13 pages.

Le Gallo, M., et al., "Precision of bit slicing with in-memory computing based on analog phase-change memory crossbars", Neuromorph. Comput. Eng. 2 (2022), Received Sep. 30, 2021, Revised Jan. 21, 2022, Accepted for Publication Jan. 27, 2022, Published Feb. 18, 2022, 15 pages.

Le Gallo, M., et al., "Using the IBM Analog In-Memory Hardware Acceleration Kit for Neural Network Training and Inference", arXiv:2307.09357v1 [cs.ET], Jul. 18, 2023, 61 pages.

Li, Y., et al., 'BRECQ: Pushing the Limit of Post-Training Quantization by Block Reconstruction', arXiv:2102.05426v2 [ cs.LG], Jul. 25, 2021, 16 pages.

(56)      References Cited

OTHER PUBLICATIONS

Nagel, M., et al., "Up or down? Adaptive Rounding for Post-Training Quantization", Proceedings of the 37th International Conference on Machine Learning, 2020, arXiv:2004.10568v2 [cs.LG], Jun. 30, 2020, 12 pages.

Nahshan, Y., et al., 'Loss aware post-training quantization', arXiv:1911.07190v2 [cs.LG], Mar. 16, 2020, 20 pages.

Park, E., et al., 'Value-Aware Quantization for Training and Inference of Neural Networks', Computer Vision—ECCV 2018, 2018, pp. 608-624.

U.S. Pending U.S. Appl. No. 18/333,966, filed Jun. 13, 2023, titled "Controlling Signal Strengths in Analog, in-Memory Compute Units Having Crossbar Array Structures", 40 pages.

Wang, P., et al., "Towards Accurate Post-Training Network Quantization via Bit-Split and Stitching", Proceedings of the 37th International Conference on Machine Learning, 2020, 10 pages, PMLR 119.

Wang. Q., et al., "A Deep Neural Network Accelerator Based on Tiled RRAM Architecture", 2019 IEEE International Electron Devices Meeting (IEDM), Dec. 2019, 4 pages.

Zhao, R., et al., "Improving Neural Network Quantization without Retraining using Outlier Channel Splitting", arXiv:1901.09504v3 [cs.LG], May 22, 2019, 10 pages.

Choukroun et al., "Low-bit Quantization of Neural Networks for Efficient Inference", arxiv.org, Cornell University Library, 201 Olin Library Cornell University Ithaca, NY 14853, Feb. 18, 2019, 10 pages, XP081030569.

International Searching Authority, "Notification of Transmittal of the International Search Report and the Written Opinion of the International Searching Authority, or Declaration," Patent Cooperation Treaty Apr. 14, 2025, 14 pages, International Application No.—PCT/ IB2025/050120.

* cited by examiner

200

100

ADAPTIVE DIGITAL-TO-ANALOG CONVERTER RANGE OPTIMIZATION

BACKGROUND

The present application relates generally to analog memory devices, and more particularly, to techniques that can adaptively optimize digital-to-analog converter (DAC) input range values for improved signal-to-noise ratio in analog in-memory computing system architectures.

Analog memory devices can be utilized for in-memory computing. Compared to traditional computing hardware, in-memory computing hardware can increase speed and energy efficiency, providing potential performance improvements. Rather than moving data from memory devices to a processor to perform a computation, analog memory devices can perform computation in the same place (e.g., in the analog memory) where the data is stored. Because there is no movement of data, tasks can be performed faster and require less energy.

BRIEF SUMMARY

The summary of the disclosure is given to aid understanding of a system and method of adaptively optimizing digital-to-analog converter (DAC) input range values for improved signal-to-noise ratio in analog in-memory computing system architectures. Optimized DAC input range values of the analog memory devices can improve the accuracy of operations performed using them, which can provide improved efficiency, and not with an intent to limit the disclosure or the invention. It should be understood that various aspects and features of the disclosure may advantageously be used separately in some instances, or in combination with other aspects and features of the disclosure in other instances. Accordingly, variations and modifications may be made to the system and/or their method of operation to achieve different effects.

In one embodiment, a method for adaptively optimizing digital-to-analog converter (DAC) input range values for improved signal-to-noise ratio of a plurality of analog memory devices is generally described. The method can include obtaining an input distribution of data input values to be received at an analog-in memory computing (AIMC) device combining a plurality of computing elements in a crossbar arrangement to form a neural network model; selecting an initial maximum data input value range from the input distribution to be received at the AIMC device; performing a neural network model operations using quantized input data values mapped from data values within the initial maximum data input value range and obtaining an initial model output value; determining a performance metric based on the obtained initial model output value; and tuning the maximum data input value range to maximize the performance metric.

In one embodiment, a system for adaptively optimizing digital-to-analog converter (DAC) input range values for improved signal-to-noise ratio is generally described. The system can include a processor, and a memory storing a plurality of instructions for configuring the processor to: obtain an input distribution of data input values to be received at an analog-in memory computing (AIMC) device combining a plurality of computing elements in a crossbar arrangement to form a neural network model; select an initial maximum data input value range from the input distribution to be received at the AIMC device; perform a neural network model operations using quantized input data values mapped from data values within the initial maximum data input value range and obtaining an initial model output value; determine a performance metric based on the obtained initial model output value; and tune the maximum data input value range to maximize the performance metric.

In one embodiment, a computer readable storage medium storing a program of instructions executable by a machine to perform one or more methods described herein also may be provided.

Further features, as well as the structure and operation of various embodiments, are described in detail below with reference to the accompanying drawings. In the drawings, like reference numbers indicate identical or functionally similar elements.

DETAILED DESCRIPTION

Figure 1:
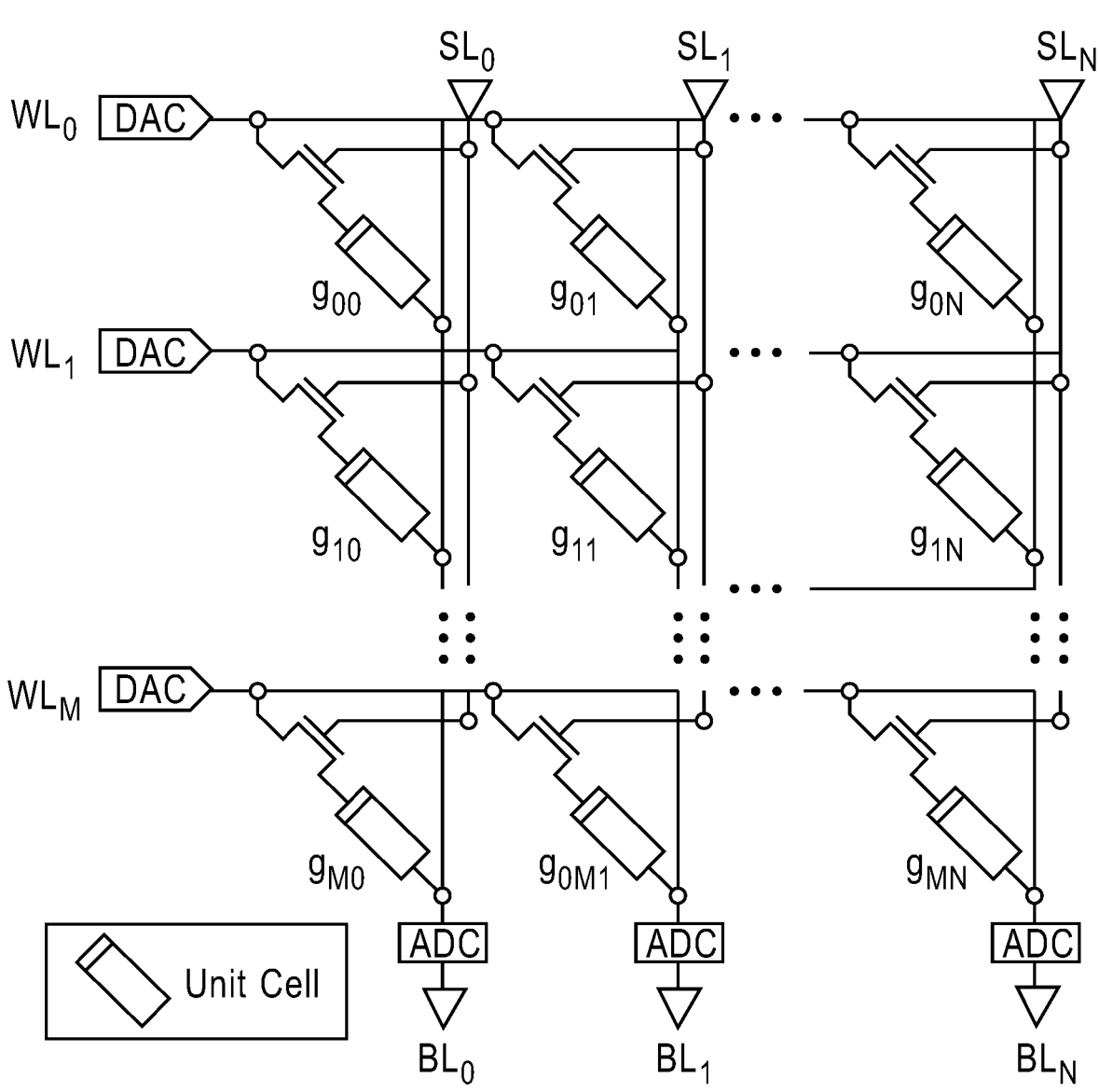
FIG. 1 is a diagram illustrating an example AIMC including a plurality of unit cells arranged in a crossbar arrangement in an embodiment.

According to an aspect of the invention, there is provided a method for adaptively optimizing digital-to-analog converter (DAC) input range values for improved signal-to-noise ratio of a plurality of analog memory devices. The method can include obtaining an input distribution of data input values to be received at an analog-in memory computing (AIMC) device combining a plurality of computing elements in a crossbar arrangement to form a neural network model; selecting an initial maximum data input value range from the input distribution to be received at the AIMC device; performing a neural network model operations using quantized input data values mapped from data values within the initial maximum data input value range and obtaining an initial model output value; determining a performance metric based on the obtained initial model output value; and tuning the maximum data input value range to maximize the performance metric.

In another aspect the tuning the maximum data input value range includes iteratively modifying the maximum data input value range to obtain a higher signal strength for the model, and at each iteration: performing the neural network model operation using quantized input data values mapped from data values within the modified maximum data input value range and obtaining a further model output value; and determining a corresponding performance metric based on the obtained further model output value; and determining an optimized maximum data input value range corresponding to the model output achieving a best corresponding performance metric.

Further to this aspect, the iteratively modifying the maximum data input value range to obtain a higher signal strength for the model includes reducing the maximum data input value range at each iteration.

Advantageously, in this aspect, the method can adaptively tighten (reduce) the maximum input range of values (e.g., $-\alpha_{max}$, $+\alpha_{max}$) to be mapped as inputs to a neural network model layer which increases the output signal strength in a plurality of unit cells of an analog memory device at a neural network model layer. The optimized input range of values ensures higher quality linear algebraic computation, e.g., Matrix Vector Multiplication operations, in the analog in-memory computing device, thus improving accuracy of the computation output.

The tightening (reducing) of the input distribution range increases the amount of input points that map to or converted to a quantized level for a given MVM operation. The larger the input for the MVM operation, the better the quality of the MVM operation.

In another aspect, the computer-implemented method further includes adding a residual noise value to the obtained initial model output value and adding the residual noise value to each further model output value obtained during each iteration, the residual noise value emulating noise introduced into a corresponding hardware neural network model. In this embodiment, the system minimizes the error introduced by the residual noise and the quantization.

Advantageously, the system and method provide an efficient post-training quantization for quick deployment/programming of a neural network model into analog in-memory computing accelerators. Using this method does not incur a significant computational overhead, but significantly increases the performance of the model on the chip.

One or more of the following aspects or features can be separable or optional from each other in one or more embodiments.

In an aspect, the obtaining an input distribution of data input values includes: inputting dummy data input values through a neural network model, and for each layer of the neural network model, recording data values that are input into every layer of the neural network model; obtaining an input distribution of data input values for a model layer from the recorded data values; and determining an optimal bounds for each tile of that the model layer based on the input distribution of data input values.

In another aspect, the performing a neural network model operation using data values within the initial maximum data input value range comprises performing a matrix vector multiplication operation on the plurality of computing elements of the AIMC device.

Yet in another aspect, the determining the performance metric based on the obtained initial model output value includes comparing the obtained initial model output against a model output value obtained from running the same neural network model operation on the corresponding hardware-based neural network model; and determining a model output value error measure based on the comparing, wherein the best corresponding performance metric corresponds to a minimized error measure.

Yet in another aspect, the determining the performance metric based on the obtained initial model output value includes: performing image classification tasks using the AIMC device based on the quantized data input values mapped from within a corresponding modified maximum data input value ranges; and determining a number of correctly classified images based on the image classification tasks and computing a corresponding accuracy score, wherein the best corresponding performance metric corresponds to a maximum accuracy score.

A system that includes at least one processor and at least one memory device can be provided, where at least one processor can be configured to perform one or more aspects of the methods described herein.

A computer program product that includes a computer readable storage medium having program instructions embodied therewith, the program instructions readable by a device to cause the device to perform at least one or more aspect of the methods described above can be provided.

An example technical use case of the methods, systems, and computer program products described herein include machine learning applications. Hardware such as analog in-memory computing devices can be used to run machine learning models. The conductance range of conductive devices in the unit cells of the analog memory device can be tuned to optimize values in order to improve the accuracy of machine learning models. Further, the conductance range optimization is performed after training of the machine learning model and prior to the hardware being programmed to run the trained machine learning model.

According to an aspect of the invention, there is provided a system and method for adaptively optimizing digital-to-analog converter input range values for improved signal-to-noise ratio for analog-in-memory computing (AIMC) systems.

A crossbar (or analog in-memory computing (AIMC)) core can include a plurality of unit cells including one or more conductive devices. These conductive devices, when arranged in a crossbar arrangement, can be used to perform multiply-accumulate (MAC) and vector-matrix multiplication (VMM) operations in as little as order O(1) time complexity. This can be accomplished by encoding inputs as either analog voltages or pulse width modulation (PWM) pulses, and encoding parameters (e.g., weights) using the conductance state of devices. Using Ohm's law, current I is a product of voltage V and conductance G (e.g., I=V×G). The current summed in each crossbar column represents one element of the resulting multiplication vector of size N. Analog memory devices can be used in various applications, such as machine learning model training and inference. Parameters of machine learning models, such as weights, can be mapped between a high or maximum conductive (Gmax) state, and a low or minimum conductive (Gmin) state of the conductive devices.

FIG. 1 is a diagram illustrating an example AIMC, in one embodiment. An AIMC 10 can communicate with one or more digital processors to facilitate operations or functions of AIMCs 10. Peripheral circuitry such as a plurality of DACs and ADCs in FIG. 1 can interface with the crossbar in the AIMC 10. To encode inputs as voltages, typically, Digital-to-Analog Converters (DACs) are used. When computation is performed using analog devices, i.e., devices with more than two conductance states (weight levels), Analog-to-Digital Convertors (ADCs) are used to convert output analog signals resulting from computations performed using the crossbar or AIMC 10 into digital signals.

Unit cells, including one or more conductive devices with conductance $g_{0,0}$, . . . , $g_{(M-1),(N-1)}$, can be arranged in a crossbar array having M−1 rows of word lines $WL_0$, . . . , $WL_{M-1}$ and N−1 columns of bit lines $BL_0$, . . . , $BL_{N-1}$. The unit cells can be arranged at cross points of the crossbar array. The unit cells in analog memory device 202 can be, for example, resistive RAM (ReRAM), conductive-bridging RAM (CBRAM), NOR flash, magnetic RAM (MRAM), and phase-change memory (PCM). In machine learning applications, the unit cells can be programmed to store and encode synaptic weights values and biases of an artificial neural network (ANN).

The conductance values $g_{00}, \ldots g_{MN}$ can encode or map a plurality of weights and biases, represented as a matrix W, of a trained machine learning model (e.g., a trained neural network). In an aspect, a conductance $g_{ij}$ can be expressed as $g_{ij}=w_{ij}(Gmax/Wmax)$, where $g_{ij}$ denotes a mapped conductance value of a conductive device at an i-th row and j-th column, $w_{ij}$ denotes the parameter or weight value to be mapped to the conductive device at an i-th row and j-th column, Gmax denotes a maximum conductance value defined for the crossbar array and Wmax is the maximum parameter value to be mapped.

In an aspect, hardware limitations and various device or circuit nonidealities of the peripheral circuitry can present challenges when deploying neural networks on low-resolution digital accelerators and analog in-memory computing architectures.

Figure 2:
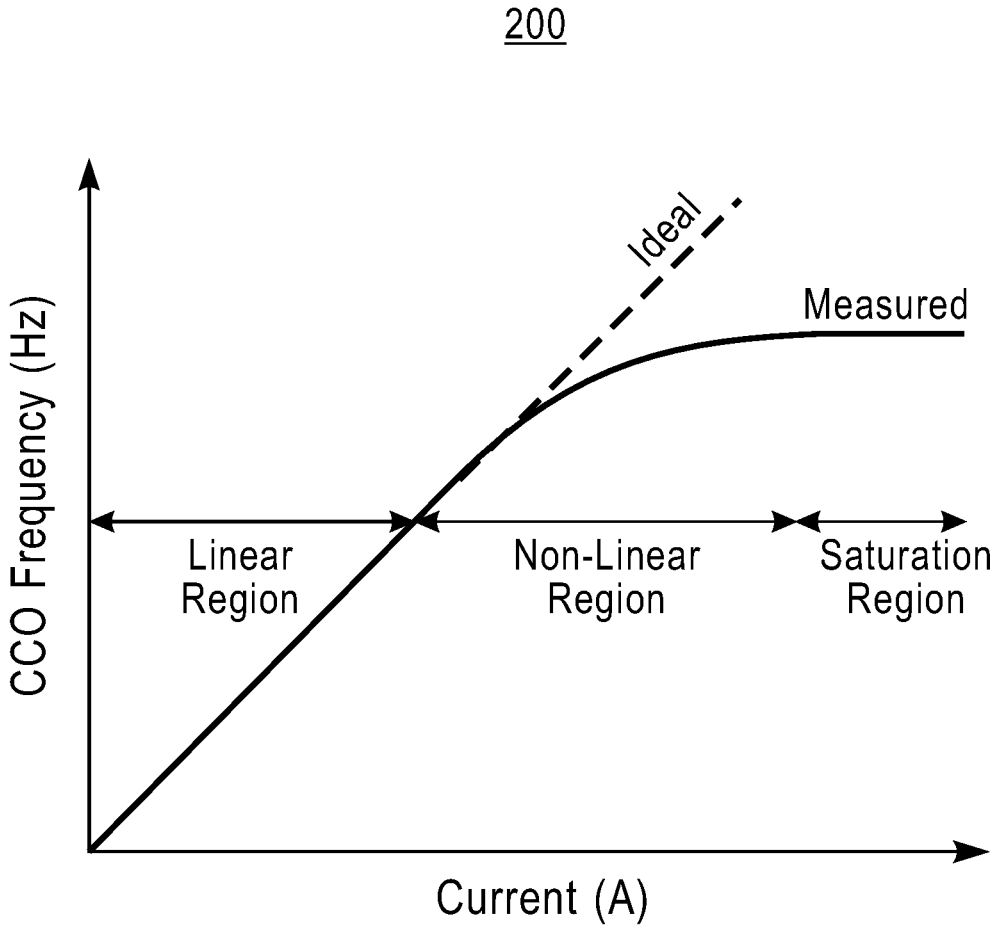
FIG. 2 is a depicts a plot of a typical transfer curve of a Current Controller Oscillator (CCO)-based ADC, and particularly a plot of a CCO frequency (Y-axis) vs current (in Amps) (X-axis).

FIG. 2 depicts a plot of a typical transfer curve 200 of a Current Controller Oscillator (CCO)-based ADC, and particularly a plot of a CCO frequency (Y-axis) vs current (in Amps) (X-axis). As can be seen, ADCs typically have non-linear and saturation regions, which should be avoided. To constrain output currents be in the linear operation region, as to not introduce significant error, the DAC (input) range is optimized.

That is, when deploying neural networks on low-resolution digital accelerators and analog in-memory computing architectures, there is fundamentally performed a Post-Training Quantization (PTQ) and clipping of weights and activations steps. Post Training Quantization (PTQ) and clipping methods can be used to quantize and clip inputs and/or weights to fixed bounds of pretrained floating-point models. Typically, PTQ yields inferior results compared to quantization aware training (QAT) that can be used to quantize and clip inputs and/or weights to fixed bounds during training, but it is still useful when QAT is not possible/too expensive. Further, analog-based accelerators are susceptible to output noise. Consequently, it is beneficial to maximize the signal strength to improve the SNR. If DACs are used, inputs must be clipped to a fixed bound; however, this results in the loss of information, and thus reduced performance. Generally, the tighter (lower in value) the input ranges used for clipping are, the stronger the signal. However, a tight input range leads to a clipping of many input signals that are larger than the input range. This incurs loss of information.

There exists a trade-off between the signal strength generated by aggressive clipping and the amount of information lost, i.e., a trade-off between the additional error introduced by clipping inputs and the accuracy gained by increasing the dynamic resolution of the inputs.

To address this, in accordance with embodiments of present disclosure, there is provided an adaptive digital-to-analog converter range optimization for improved Signal-to-Noise Ratio (SNR) in AIMC architectures/systems.

To be described in more detail below, for adaptive digital-to-analog converter range optimization, the AIMC system and method provides for the collecting of input samples for each specific analog layer in the neural network. The method starts by initializing a very loose input range (typically the maximum of the collected input samples) and then evaluate a matrix-vector-multiplication (MVM) error under the influence of some residual error (e.g., noise) that is introduced to the result of the MVM.

In an embodiment, an l2 error is obtained for this input range and the l2 error is recorded and, in the next step, the input range is tightened some more. This boosts the signal strength, but also incurs loss of information. Then, again, the system and method performs the MVMs with the collected inputs and repeat this for a variable number of input ranges that get smaller and smaller. In the end, the system and method selects the input range that produced the lowest l2 error.

Figure 3:
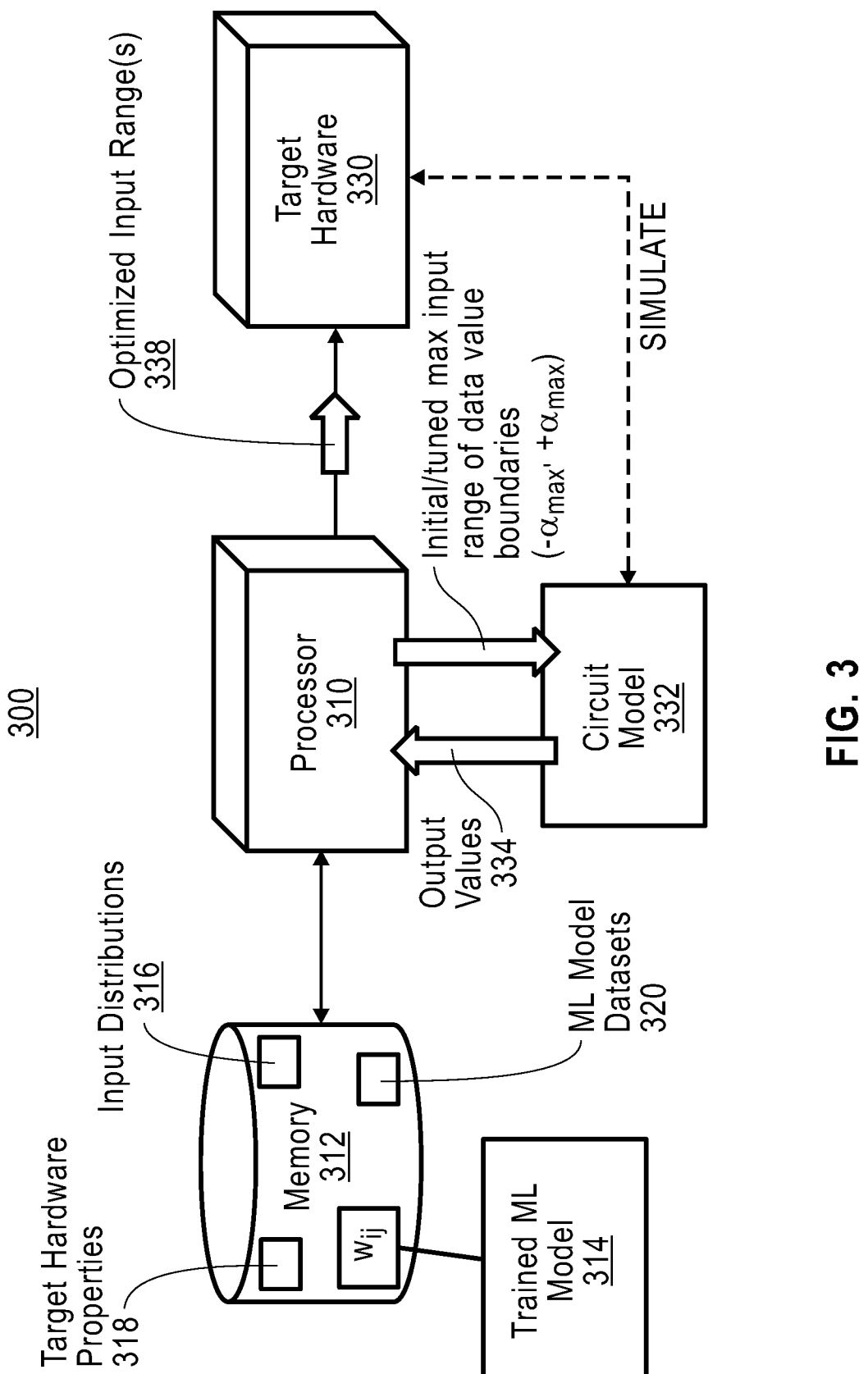
FIG. 3 is a diagram illustrating an example system that can adaptively optimize digital-to-analog converter (DAC) input range values for improved signal-to-noise ratio in analog in-memory computing system architectures in one embodiment.

FIG. 3 is a diagram illustrating an example system 300 that can adaptively optimize DAC input range values for improved signal-to-noise ratio in analog in-memory computing system architectures in one embodiment. The system of FIG. 3 can perform a tuning of the input ranges of the digital-to-analog converters of a "tile", comprised of processing elements (PEs) in a crossbar arrangement, in one embodiment, to minimize/maximize some error metric quantifying the quality of the analog MVMs under the presence of some residual noise term that is applied to the output of the MVM.

System 300 shown in FIG. 3 can be a computing system including at least a processor 310 and a memory 312. Processor 310 can be composed of at least one of microprocessors, microcontrollers, central processing units (CPU), single core processors, multi-core processors, other types of processors, and/or computing hardware composed of analog and/or digital circuitry. Memory 312 can be composed of at least one of volatile memory (e.g., random access memory (RAM) including static RAM and dynamic RAM, and/or other volatile memory (e.g., read only memory (ROM), erasable programmable ROM, and electrically erasable programmable ROM, and/or other non-volatile memory). Memory 312 can be configured to store data in digital form and can be configured to store instructions as various forms of program code. Processor 310 can be configured to access and run program codes stored in memory 312 to perform various computer operations.

In one embodiment, memory 312 can be configured to store program code such as source code and/or executable code that can be accessed by processor 310 to run various applications and programs. By way of example, processor 310 can access program code stored in memory 312 to run a circuit modeling application that generates one or more circuit models simulating operations of hardware devices, such as analog memory devices. Processor 310 can also access various types of data being stored in memory 312.

In a further embodiment, memory 312 can include input data distribution (e.g., floating point numbers) that include a maximum input range of floating point number values (e.g., boundaries or extrema values $-\alpha_{max}$, $+\alpha_{max}$) from which quantized data values are provided, i.e., the extrema values $-\alpha_{max}$, $+\alpha_{max}$ provide an input range used for quantizing the input at an AIMN tile in target hardware 330.

In an embodiment, memory 312 can store parameters, such as weights $w_{ij}$ and biases, of a trained machine learning (ML) model 314. The trained ML model 314 parameters are to be programmed and/or encoded in a target hardware 330. Once the parameters of trained ML model 314 are programmed and/or encoded in target hardware 330, target hardware 330 can be deployed to perform inference or classification tasks. Target hardware 330 can be an analog memory device, including a plurality of unit cells arranged in a crossbar arrangement. Each one of the plurality of unit cells can include non-volatile memory (NVM) devices implemented by conductive devices. In one embodiment, target hardware 330 can be an AIMC 10, as shown in FIG. 1.

In one embodiment, after programming target hardware 330 with parameters of a trained ML model 314, the processor 310 can be configured to automatically adapt DAC converter range optimization for improving the SNR by increasing a difference in level in an output signal level vs. noise introduced by the AIMC components of the target hardware 330. The automatic adapting of DAC converter range optimization can first begin with a processor 310 programming the desired network weights to unit cells of the AIMC tile(s) that are required for target hardware 330 to generate output currents representing results of MAC operations, VMM operations, or MVM operations that can be performed by the target hardware 330 when performing ML model operations. The parameters and properties that can be determined by processor 310 may include known information such as target hardware properties 318. Target hardware properties 318 can include at least one of, a number and composition of unit cells in target hardware 330, the physical conductance range of each unit cell in target hardware 330, input voltage range, transfer functions of the ADCs in the target hardware 330, weight and output noise model parameters, parameters relating to sources of non-linear errors (e.g., line resistances), process variation constants for circuit elements in target hardware 330, and other properties of the target hardware 330. In one embodiment, the known information being determined by processor 310 can be dependent on an approach being used by target hardware 330 to compute and/or approximate output currents.

Processor 310 can set or define an initial maximum input range of values (e.g., $-\alpha_{max}$, $+\alpha_{max}$) within which define the range of input data values to be quantized by DACs for input to the AIMC tile modeling a layer in a neural network model of the target hardware 330. In one embodiment, the processor first obtains an input distribution of the actual floating point values for input to initial layer of a trained neural network modeled at the target hardware 330 to define the maximum input range of values (e.g., between $-\alpha_{max}$, $+\alpha_{max}$).

Processor 310 can obtain (e.g., retrieve from memory 312) the initial maximum input range of values (e.g., $-\alpha_{max}$, $+\alpha_{max}$) and perform methods to modify or tune the maximum input range of values (e.g., $-\alpha_{max}$, $+\alpha_{max}$) that maximizes a signal to noise (SNR) ratio when performing model operations, e.g., MVM operations for inference or classification tasks. Processor 310 can use target hardware properties 318, the conductance values encoding parameters $w_{ij}$ to program a circuit model 332 in one embodiment. The circuit model 332 can be a virtual model or representation of the target hardware 330 that simulates operations, parameters, and properties of target hardware 330. Circuit model 332 can compute or estimate the output current distributions of the ADCs given the input word-line voltages. In one embodiment, circuit model 332 can be realized using a behavioral-based or physics-based model, such as a SPICE model (e.g., a text-description of an AIMC that can be used by a SPICE Simulator to mathematically predict the behavior of the AIMC under varying conditions). Processor 310 can also be configured to adjust these simulated parameters and properties of circuit model 332. In an embodiment, processor 310 can program circuit model 332 to have specifications in virtual space that may be identical or substantially identical to specifications of target hardware 330 in physical space. By way of example, programming circuit model 332 using the conductance values to encode weights $w_{ij}$ in circuit model 332 can allow processor 310 to simulate operations of target hardware 330.

In order to run the circuit model 332, the processor 310 can provide inputs to the circuit model 332 in order for the circuit model 332 to perform operations, such as MAC, MVM or VMM operations or like linear algebraic operation, to generate an output values 334. By way of example, the target hardware 330 can be an AIMC 10, shown in FIG. 1, and the circuit model 332 can simulate the AIMC 10. Processor 310 can determine inputs to be applied on the word lines $WL_0, \ldots, WL_M$, and feed the determined inputs to circuit model 332. Processor 310 can be configured to determine the input to be provided to circuit model 332. Memory 312 can store a ML model dataset 320 that includes at least a training set used in training of trained ML model 314, a validation set used in an accuracy evaluation during training of trained ML model 314, or a test set used in a performance evaluation (post training) of the trained ML model 314.

In one embodiment, processor 310 can determine the input to be provided to circuit model 332 by sampling subsets of at least one of either the training set, the validation set, or the test set. For example, processor 310 may sample subsets from the training set. As another example, processor 310 may sample subsets from the validation set. As yet another example, processor 310 may sample subsets from the test set. Yet as another example, processor 310 may sample subsets from two or more of those sets, e.g., two or more combinations of the training set, the validation set and the test set. In accordance with an embodiment, processor 310 can select a specific distribution (e.g., statistical distribution) from a plurality of candidate distributions, such as input distributions 316 stored in memory 312. The selected distribution can be a distribution that best fits the training set that was used for training of trained ML model 314. Processor 310 can input the selected distribution as an input to circuit model 332. In embodiments, the input distributions are floating point number values within a max input range that are to be mapped as quantized signals, e.g., int8 bit values ranging between −128 to 127) for processing by the AIMC tile. Typically, an input distribution of floating point numbers define a Gaussian distribution of input data values (e.g., within a range between values $-\alpha$ (max), $+\alpha$ (max)) that are input to the neural network model and/or input to intermediate (i.e., hidden) layers of the neural network model. By clipping (cutting off) outlier values, the input distribution range (between $-\alpha$ (max), $+\alpha$ (max)) becomes restricted (the input range distribution is tighter), thereby increasing the signal to noise (SNR) ratio of the outputs. This input range tightening is advantageous as there are more larger inputs values leading to higher signal strengths which improves quality of MVM operations. The system of FIG. 3 automatically determines the optimal boundary values ($-\alpha$ (max), $+\alpha$ (max)) to restrict the floating point input range so that the mapping of an input floating point value to the quantized signal improves the quality of the MVM operation performed.

Processor 310 can select the first AIMC tile(s) that belong to the first layer of the model for processing and successively process data inputs at each additional AIMC tile(s) that belong to the first layer of the model. For each neural network model layer, at each AIMC tile(s) that receive(s) input data for processing through the network, the input data at a layer is recorded so that processor 310 determines the distribution of the inputs that are to be processed by the tiles at each layer. The processor 310 runs the circuit model 332 with the collected inputs, and the circuit model 332 can output current values 334 that simulate currents being outputted from bit lines $BL_0, \ldots, BL_N$ of the AIMC 10.

In an embodiment, processor 310 can then analyze the input distribution 316 to determine an initial DAC (input) range setting of each AIMC tile such that the average SNR for all columns (with respect to the output noise) is approximately equal to a predetermined value.

In this way, processor 310 of system 300 can determine at least one property of output values 336, such as the mean, median, mode, standard deviation, entropy, skew, minimum and maximum values, an k-th quartile, or other properties. Processor 310 can adaptively update the maximum input range of values (e.g., between $-\alpha_{max}$, $+\alpha_{max}$) in circuit model 332 based on the determined properties of output values 336 and optimize the trade-off between the signal strength generated by aggressive clipping of the DAC input ranges to increase the tightness of the input range distribution (e.g., reduce boundary values $-\alpha_{max}$, $+\alpha_{max}$) and the amount of information lost. Generally, the tighter (lower in value) the input ranges used for clipping are, the stronger the signal. However, too tight an input range leads to a clipping of many input signals that are larger than the input range which causes loss of information.

In one embodiment, the processor 310 can perform optimization techniques to adjust the input range floating point values that are quantized in the circuit model 332 until optimized data input ranges 338 are determined for each column, or different groups of columns, or unit cells in target hardware 330. Processor 310 can adjust the input data range of floating point values of circuit model 332, i.e., adjust (−α (max), +α (max)) values, to cause circuit model 332 to generate updated output current values 334. Processor 310 can repeat the adjustment of the maximum input range of floating point values in circuit model 332 and update the input distribution 316 until a stopping criterion, such as when an output distribution satisfies a defined objective, e.g., optimizes the SNR of the target hardware 330. The input range of floating point values in circuit model 332 that causes the output distribution to satisfy a defined objective can be set by processor 310 as an optimized input range of floating point values 338. In one embodiment, the stopping criterion can also be an upper bound, on a maximum number of iterations or adjustments made to the adjust the input data range of floating point values in circuit model 332.

In an embodiment, the target hardware 330 can be calibrated by determining the optimized input data range of floating point values 338 that the DAC devices at the wordline inputs $(WL_0, WL_1, \ldots, WL_M)$ of target hardware 330 can receive. Target hardware 330 can be calibrated prior to being deployed to various applications for performing inference on new input data.

Figure 4A:
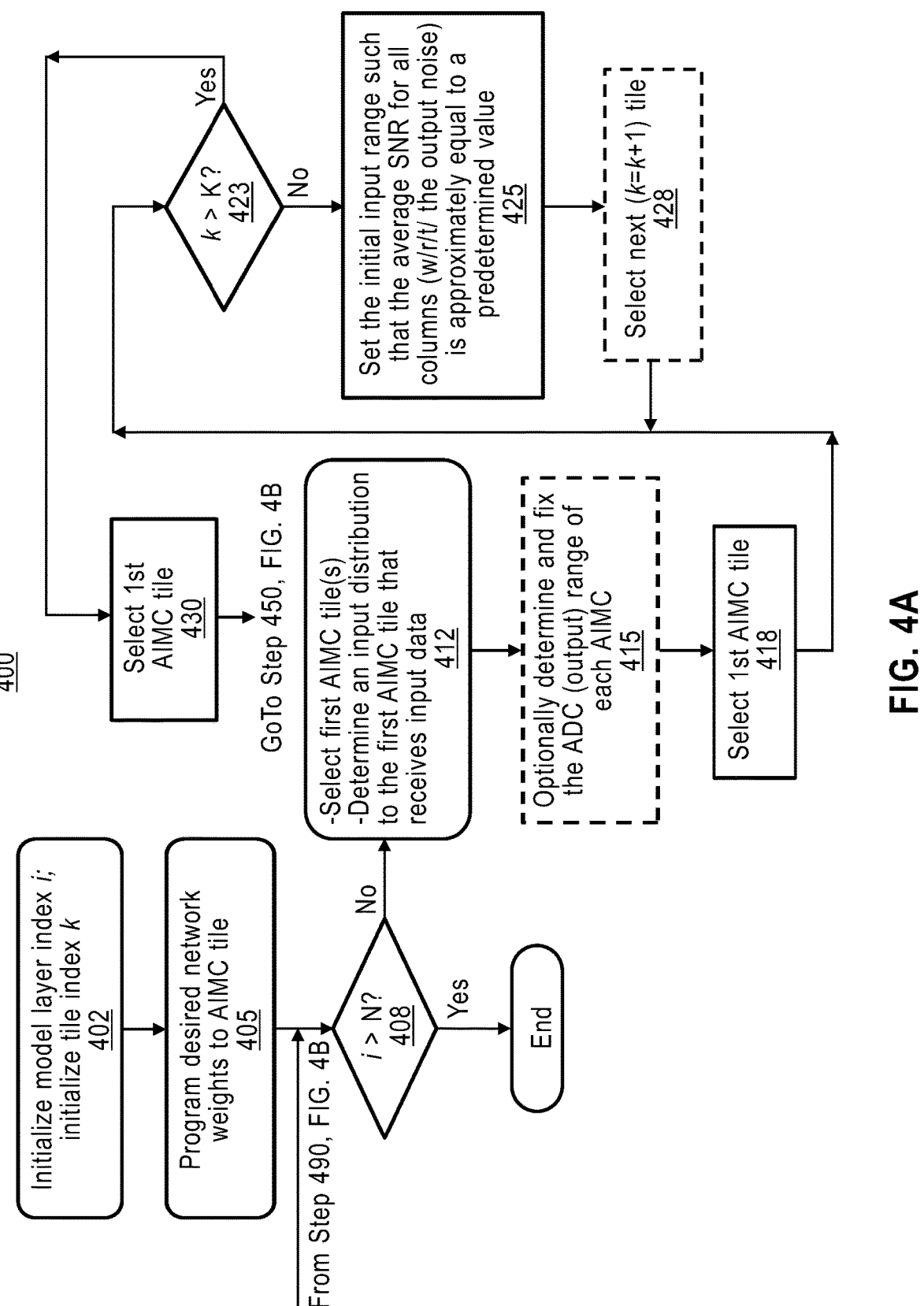
FIGS. 4A-4B illustrate a process to adaptively optimize digital-to-analog converter (DAC) input range values for improved signal-to-noise ratio in one embodiment.
Figure 4B:
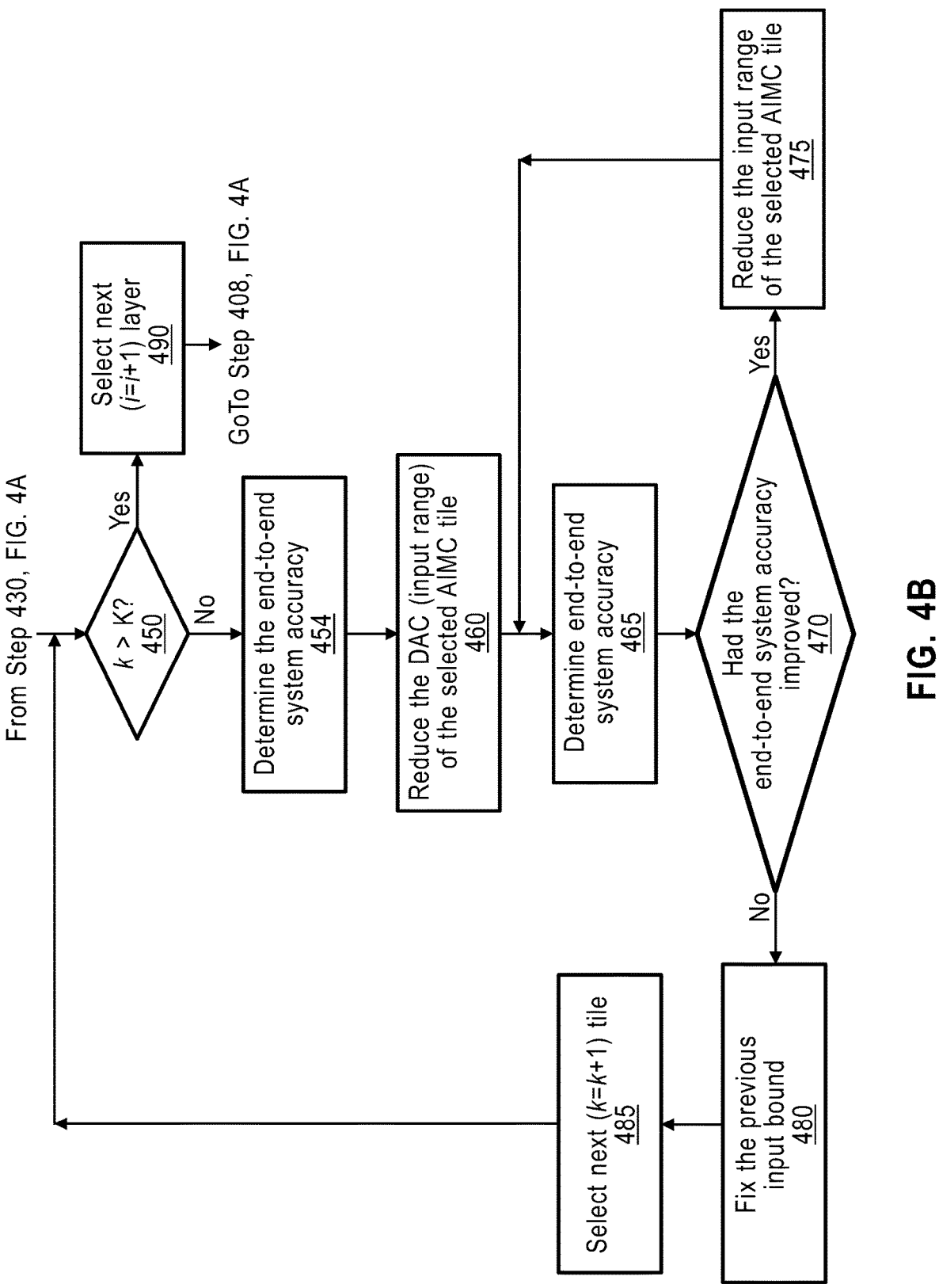

FIGS. 4A-4B depict a flow chart illustrating a process 400 for automatically optimizing the input range floating point values that are quantized for processing in AIMC tiles in one embodiment. Process 400 can be performed by system 300 shown in FIG. 3. In one embodiment, process 400 can be performed to automatically adapt DAC range optimization for improved SNR in each individual AIMC architectures/system. Process 400 can begin at a block 402. At block 402, a processor (e.g., processor 310) can initialize the neural network model layer index i, where i=1, . . . , N, and initialize AIMC tile index k, where tile k=1, . . . , K in an analog memory device. For example, the first AIMC tile is selected that belongs to the first layer of the model. Process 400 can proceed from block 402 to block 405. At block 405, the processor can program desired network weights to the AIMC tile. The network weights for the particular neural network model are known and correspond to different conductance values for the unit cells in a particular row/column in the tile shown in FIG. 1. The network weight values are thus programmed for each individual column of unit cells, or for groups or regions of columns of unit cells in the AIMC tile. Then, at block 408, the processor can determine whether the last model layer has been processed, i.e., whether i>N. If it is determined that the last layer has been processed, the process ends. However, if it is determined that the last layer has not been processed, the process continues to 412 where the processor can determine an input distribution (of floating point values) to the input line DACs of the first AIMC tile that receives input data at the current layer.

The next steps determine the input distribution to the current AIMC tile(s) that receive(s) input data by collecting inputs that are processed by the current layer. In an embodiment, the inputs sampled from a representative input distribution can be used or, alternatively, inputs from a training or validation set can be used. In a non-limiting embodiment, dummy data input values are input through the model, and for each layer of the neural network model, values that are input into every layer of the neural network model are recorded. The recorded data values are used to adjust the floating point values (input ranges) which are an optimal bounds used for clipping inputs for each tile of that the model layer.

Then, at 415, the processor can optionally determine and fix the ADC (output) range of each AIMC tile. The processor is programmed to ultimately determine the optimal input range such that the average SNR for all columns (with respect to the output noise) is approximately equal to a predefined value. Continuing to 418, the processor can select the first AIMC tile for the current layer and at 423 determines whether this selected tile is the last tile for this neural network layer, i.e., whether tile k>K. If it is determined that the selected tile is the last tile, the process proceeds to step 430 where the first AIMC tile is again selected and the process proceeds to step 450, FIG. 4B.

Returning to step 423, if it is determined that the selected tile is not the last tile, i.e., k≤K, the process proceeds to 425 where the processor sets the initial input range such that the average SNR for all columns (w/r/t/ the output noise) is approximately equal to a predetermined value. Then, continuing to 428, the processor then selects the next tile by incrementing k, k=k+1 and selecting the next tile k and the process returns to step 423 to further determine if the current tile is the last tile of that network model layer and if the next tile is not the last tile, the process proceeds back to 425 to set the initial input range such that the average SNR for all columns (w/r/t/ the output noise) is approximately equal to a predetermined value. Then the next tile is selected at 428 by incrementing k, k=k+1 and the next tile k is selected. The processor repeats steps 423, 425 and 428 to ensure that initial input range is such that the average SNR for all columns (w/r/t/ the output noise) is approximately equal to a predetermined value. Thus, the method determines and fixes the ADC (output) range of each AIMC tile.

In an alternate embodiment, step 428 is optional. That is, in an alternate embodiment, when the processing of a layer is completed, the input distribution for that layer is obtained for the next layer and the process then moves to the tiles of the next layer. The first input range can just be the maximum value of the input distribution collected for that layer. Thus, step 428 can alternatively entail choosing initial input range according to a methods such as taking the abs(max( )) of the input distribution or a quantile of the input distribution (in order to remove outliers).

Returning to 430, after repeating the steps 423, 425, 428 to ensure that initial input range is such that the average SNR for all columns (w/r/t/ the output noise) is approximately equal to a predetermined value, the method selects the first AIMC tile (e.g., sets k=1) and proceeds to 450, FIG. 4B. At step 450, FIG. 4B. a determination is made as to whether this current selected tile is being processed is the last tile for this neural network layer, i.e., whether tile k>K. If it is determined that the selected tile is not the last tile, the process proceeds to step 454 where the processor can determine the end-to-end system accuracy. That is, the neural network model is run with the current input range and an added residual noise level and the processor determines an accuracy of the output value of the model. In an embodiment, the added residual noise level is added to emulate what the target hardware is doing, i.e., knowing amount of noise the hardware introduces so as to simulate the effect of noise to optimize performance metric for the given hardware. That is, the residual noise value matches a noise characteristic between hardware and simulation- and can be a random gaussian vector added to the output of the MVM. In an embodiment, the output noise model can be a function that, given the inputs and weights of the network, as well as other hardware specific parameters, generates a noise vector that is added to the output of the MVM. A simple example function is one that generates a Gaussian vector, e.g., with a mean of 0 and std=0.1 as long as the output noise model mimics the behavior of the system.

Then, the network can perform an MVM operation using the data within current input range and determine an output accuracy or like error metric of the performed MVM operation. Generally, an MVM operation performed on a hardware neural network model is according to:

$$Y = M * x$$

where M is matrix and x is an input vector of floating point (e.g., FP32) values within the current distribution range. However, according to an embodiment herein, the simulated MVM operation in the method becomes:

$$Y' = (M + \eta\_w) * x\_int8 + \eta\_out;$$

where $\eta\_w$ is a modeled matrix weight noise error, $x\_int8$ is a quantized form of the input data and $\eta\_out$ is the introduced residual noise error. The quantization conversion to int_8 is dependent upon the hardware, and can be based on 9 bit (Int9) or 10-bit (int10) quantization levels. The output l2 error can be determined using an l2 function to provide a difference metric between Y and Y'. This can be determined using a downstream task, e.g., performing an image classification task, using the simulated AIMC tiles. Thus, for a given initial maximum data input value range, the downstream task will classify one or more images and compute the number of images that are classified correctly to obtain a score. In an embodiment, there is passed through a plurality of images in the AMIC device emulating the neural network classification model. The method responsively computes the image classification and determines how many images are classified correctly to obtain an accuracy score. The process is iteratively repeated with modified i.e., tightened, maximum data input value range at each iteration. The tightened maximum data input value range is then chosen that gives the highest accuracy score or achieves the best performance metric, i.e., maximizes accuracy. Other tasks/metrics can be performed for use in evaluating and determining the optimal input range that gives the best performance score (accuracy).

In an embodiment, a determination of the end-to-end system accuracy at 454 can be based upon whether the "l2" _error is minimized or whether some performance metric has been maximized/minimized. In an embodiment, the accuracy can be determined by the measured SNR at the model output. The process continues to 460 where the processor can reduce the DAC input range of the selected AIMC tile, i.e., further clip (tighten) the floating point number maxima and minima $(-\alpha_{max}, \alpha_{max})$ input to the model layer. Then continuing to 465, the processor again determines the end-to-end system accuracy as in step 454, e.g., by measuring the error metric, output value accuracy, or measured output SNR. In an embodiment, the determining of the performance metric is based on an obtained model output value and includes comparing the obtained simulated initial model output against a model output value obtained from running the same neural network model operation on the corresponding hardware-based neural network model (target hardware 330) being simulated. The determined model output value error measure is based on the comparing, such that the best corresponding performance metric corresponds to a minimized error measure. In an embodiment, the input values makes use of the end-to-end system accuracy measures to determine whether the additional error introduced to the network by clipping inputs exceeds the accuracy gained by increasing the dynamic resolution of the input. For example, there exists a trade-off as more the input signals are clipped, the system SNR is increased; however information is lost about the input (due to the clipping of some input values).

Upon determining an end-to-end system accuracy at the reduced input range at 465, FIG. 4B, the method proceeds to 470 where a determination is made as to whether the end-to-end system accuracy has improved, i.e., whether the output value accuracy of the MVM operation or SNR level has increased or whether the error of the MVM operation output has decreased. If at 470, it is determined that the end-to-end system accuracy has improved, the process proceeds to 475, FIG. 4B where the processor can again reduce the DAC input range of the selected AIMC tile, i.e., further clip (tighten) the floating point number maxima and minima $(-\alpha_{max}, \alpha_{max})$ input to the current model layer. The process then returns back to 465 to again determine the end-to-end system accuracy at the reduced input range and, at 470, determine whether the end-to-end system accuracy has improved as a result. In an embodiment, the end-to-end system accuracy is a simulated accuracy using a model of the output noise. The steps 465, 470, 475 are repeated until such time that the end-to-end system accuracy does not improve, or whether a fixed maximum number of iteration have been performed. By repeating steps 465, 470, 475 the processor reduces the DAC input range of the selected AIMC tile, i.e., further clip (tighten) the floating point number maxima and minima $(-\alpha_{max}, \alpha_{max})$ input to the model layer, until there is no appreciable end-to-end system accuracy improvement. At such time it is determined that a reduced input range does not appreciably improve end-to-end system accuracy, the process returns to 480, FIG. 4B to fix the previous input bound. Then, the process proceeds to 485 where the processor selects the next tile, i.e., select next tile by incrementing k (i.e., k=k+1). After incrementing the next tile index k, the process returns to 450 where the processing of FIG. 4B is repeated with the input values for the next tile. Then the method steps of FIG. 4B are repeated for the next tile in the current layer in order to adapt the DAC input range of the next selected AIMC tile, i.e., further clip (tighten) the floating point number maxima and minima $(-\alpha_{max}, +\alpha_{max})$ input to the next tile at the current model layer. As a result of repeating steps 450 to 485 of FIG. 4B, the system determines the optimum DAC input range (floating point values to be quantized by the DACs) of each of the AIMC tiles of the current neural network model layer. Upon a determining at 450 that all AIMC tiles have been processed at the current neural network layer, i.e., that tile k>K, the process proceeds to 490 where the processor can select the next layer of the neural network model to be processed, e.g., by first incrementing the model layer index i (i.e., i=i+1), and then proceeding back to step 408, FIG. 4A. Then, the processor can process the input range of values for the next model layer and set the initial range of input values for each tile of the next layer such that the average SNR for all columns (w/r/t/ the output noise) for each tile is approximately equal to a predetermined value.

In an embodiment, the method 400 of FIGS. 4A, 4B are repeated for each tile(s) at each neural network model layer, with the end result being a vector of $\alpha_{max}$ (and corresponding $-\alpha_{max}$) values for each layer of AIMC tile(s). The system thus automatically provides an optimized "clipping" of the input range of values, i.e., a boundary $+\alpha_{max}$ (and corresponding $-\alpha_{max}$) value that ensures a maximum accuracy, i.e., improved SNR in the AIMC architecture.

In an embodiment, the method of FIGS. 4A-4B can be performed as part of a calibration phase and applied using the actual hardware. For example, a cell phone product can have a computing AIMC integrated circuit, e.g., for performing image recognition/classification, and prior to shipping the product, the AIMC IC can be calibrated. In the calibration, the method 400 of FIGS. 4A, 4B is performed for the AIMC to obtain the optimal input ranges $(-\alpha_{max}, \alpha_{max})$. The determined input range values $-\alpha_{max}, +\alpha_{max}$ for the AIMC chip can be programmed or otherwise stored in registers at the AIMC IC. The input range values are quantized by the DACs that convert the floating point values x into x_int8 values and can correspond to voltage pulse lengths applied as input rows of the crossbar.

In an embodiment, in view of FIG. 4A, at step 412, the selecting the first AIMC tile(s) that belong to the first layer of the model and determining the input distribution to the current AIMC tile(s) of the current layer that receive(s) input data is repeated for each layer, i.e., the method re-samples the inputs that come into one layer, after calibrating the previous layers' input range. Alternatively, the input distribution range for current AIMC tiles of a layer can be selected first, and then only the inputs coming into each layer is sampled once. That is, in an alternative embodiment, using recorded inputs into every tile, the input ranges can be pre-determined using a method for calculating the dynamic ranges of activations which can be done with an exponential moving average, or by buffering the activations and then computing the abs(max)) on the activations or a quantile on the activations. Then, starting at the tiles of the first layer, the method iteratively tightens the input ranges for these tiles until there is no improvement observed with respect to downstream performance under the output noise model that mimics the behavior of the system. Then, without re-sampling the inputs for the next layer, the process is repeated for the next layer.

Figure 5:
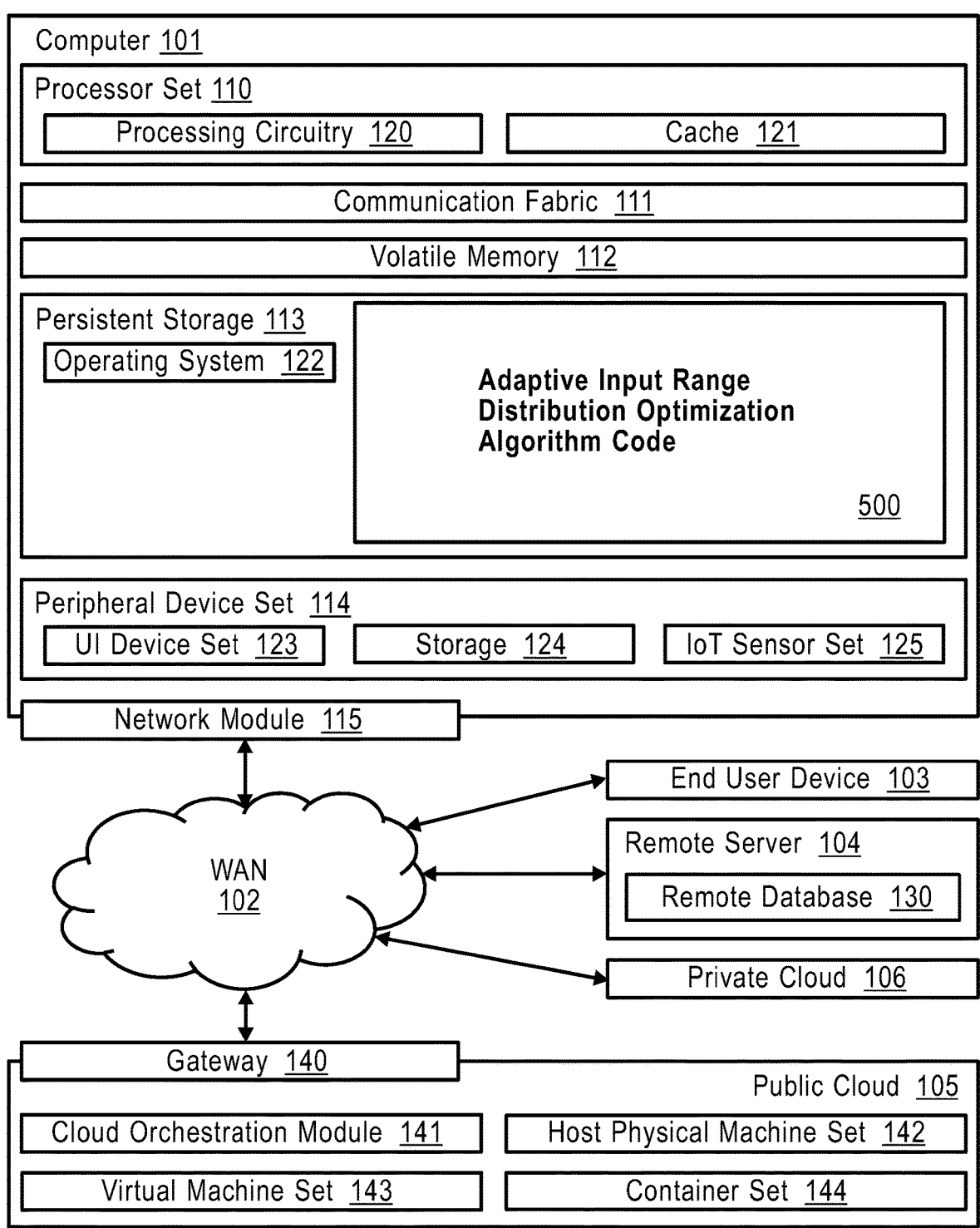
FIG. 5 illustrates an example computer or processing system or environment that may implement a system for adaptive optimization of DAC input range values in one embodiment.

FIG. 5 illustrates an example computer or processing system or environment that may implement a system for adaptively optimizing digital-to-analog converter (DAC) input range values for improved signal-to-noise ratio in analog in-memory computing system architectures in one embodiment. As shown in FIG. 5, computing environment 100 can include an example of an environment for the execution of at least some of the computer code involved in performing the inventive methods described herein, such as the adaptive optimization of the input range values algorithm code 500. In addition to block 500, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI), device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers.

IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101) and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "or" is an inclusive operator and can mean "and/or", unless the context explicitly or clearly indicates otherwise. It will be further understood that the terms "comprise", "comprises", "comprising", "include", "includes", "including", and/or "having," when used herein, can specify the presence of stated features, integers, steps, operations, elements, and/or components, but do not preclude the presence or addition of one or more other features, integers, steps, operations, elements, components, and/or groups thereof. As used herein, the phrase "in an embodiment" does not necessarily refer to the same embodiment, although it may. As used herein, the phrase "in one embodiment" does not necessarily refer to the same embodiment, although it may. As used herein, the phrase "in another embodiment" does not necessarily refer to a different embodiment, although it may. Further, embodiments and/or components of embodiments can be freely combined with each other unless they are mutually exclusive.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
   obtaining an input distribution of data input values to be received at an analog-in memory computing (AIMC) device combining a plurality of computing elements in a crossbar arrangement to form a neural network model;
   selecting an initial maximum data input value range from said input distribution to be received at the AIMC device;
   performing neural network model operations using quantized input data values mapped from data values within said initial maximum data input value range and obtaining an initial model output value;
   determining a performance metric based on said obtained initial model output value; and tuning the maximum data input value range to maximize the performance metric, said tuning comprising clipping outlier values of the input distribution of data input values to restrict the input distribution range of data input values and increase a signal to noise (SNR) ratio of a model output value when performing the neural network model operations.

2. The method according to claim 1, wherein tuning the maximum data input value range comprises:

iteratively modifying the maximum data input value range to obtain a higher signal strength for said model, and at each iteration:

performing the neural network model operation using quantized input data values mapped from data values within said modified maximum data input value range and obtaining a further model output value; and determining a corresponding performance metric based on the obtained further model output value; and determining an optimized maximum data input value range corresponding to the model output achieving a best corresponding performance metric.

3. The method according to claim 2, wherein input data value within the initial maximum data input value range is a floating point value, the method further comprising, at each iteration:

obtaining, from a digital-to-analog converter, the quantized input data values of data values mapped from floating point values within the modified maximum data input value range.

4. The computer-implemented method as claimed in claim 2, further comprising:

adding a residual noise value to the obtained initial model output value and adding the residual noise value to each further model output value obtained during said each iteration, the residual noise value emulating noise introduced into a corresponding hardware neural network model.

5. The computer-implemented method as claimed in claim 1, wherein the obtaining an input distribution of data input values comprises:

inputting dummy data input values through a neural network model, and for each layer of the neural network model, recording data values that are input into every layer of the neural network model, obtaining an input distribution of the dummy data input values for a model layer from the recorded data values; and determining an optimal bounds for each tile of that the model layer based on the input distribution of the dummy data input values.

6. The computer-implemented method as claimed in claim 2, wherein the iteratively modifying the maximum data input value range to obtain a higher signal strength for said model comprises: reducing the maximum data input value range at each iteration.

7. The computer-implemented method as claimed in claim 2, wherein the performing a neural network model operation using data values within said initial maximum data input value range comprises: performing a matrix vector multiplication operation on the plurality of computing elements of the AIMC device.

8. The computer-implemented method as claimed in claim 6, wherein said determining the performance metric based on said obtained initial model output value comprises:

comparing the obtained initial model output against a model output value obtained from running the same neural network model operation on the corresponding hardware-based neural network model; and determining a model output value error measure based on the comparing, wherein the best corresponding performance metric corresponds to a minimized error measure.

9. The computer-implemented method as claimed in claim 6, wherein said determining the performance metric based on said obtained initial model output value comprises:

performing image classification tasks using the AIMC device based on the quantized data input values mapped from within a corresponding modified maximum data input value ranges; and determining a number of correctly classified images based on said image classification tasks and computing a corresponding accuracy score, wherein the best corresponding performance metric corresponds to a maximum accuracy score.

10. A system comprising:

a processor, and a memory storing a plurality of instructions for configuring the processor to:

obtain an input distribution of data input values to be received at an analog-in memory computing (AIMC) device combining a plurality of computing elements in a crossbar arrangement to form a neural network model;

select an initial maximum data input value range from said input distribution to be received at the AIMC device;

perform neural network model operations using quantized input data values mapped from data values within said initial maximum data input value range and obtain an initial model output value;

determine a performance metric based on said obtained initial model output value; and tune the maximum data input value range to maximize the performance metric, wherein to tune, said processor is further configured to clip outlier values of the input distribution of data input values to restrict the input distribution range of data input values and increase a signal to noise (SNR) ratio of a model output value when performing the neural network model operations.

11. The system according to claim 10, wherein to tune the maximum data input value range, the processor is further configured to:

iteratively modify the maximum data input value range to obtain a higher signal strength for said model, and at each iteration:

perform the neural network model operation using quantized input data values mapped from data values within said modified maximum data input value range and obtaining a further model output value; and determine a corresponding performance metric based on the obtained further model output value; and determine an optimized maximum data input value range corresponding to the model output achieving a best corresponding performance metric.

12. The system according to claim 11, wherein input data value within the initial maximum data input value range is a floating point value, the processor further configured to, at each iteration:

obtain, from a digital-to-analog converter, the quantized input data values of data values mapped from floating point values within the modified maximum data input value range.

13. The system as claimed in claim 11, wherein the processor is configured to:

add a residual noise value to the obtained initial model output value and add the residual noise value to each further model output obtained during said each iteration, the residual noise value emulating noise introduced into a corresponding hardware neural network model.

14. The system as claimed in claim 11, wherein to iteratively modify the maximum data input value range to obtain a higher signal strength for said model, the processor is further configured to: reduce the maximum data input value range at each iteration.

15. The system as claimed in claim 11, wherein to determine the performance metric based on said obtained initial model output value, the processor is further configured to:

compare the obtained initial model output against a model output value obtained from running the same neural network model operation on the corresponding hardware-based neural network model; and determine a model output value error measure based on the comparing, wherein the best corresponding performance metric corresponds to a minimized error measure.

16. The system as claimed in claim 11, wherein to determine the performance metric based on said obtained initial model output value, the processor is further configured to:

performing image classification tasks using the AIMC device based on the quantized data input values mapped from within a corresponding modified maximum data input value ranges; and determining a number of correctly classified images based on said image classification tasks and computing a corresponding accuracy score, wherein the best corresponding performance metric corresponds to a maximum accuracy score.

17. A computer program product comprising a computer readable storage medium having program instructions embodied therewith, the program instructions readable by a device to cause the device to:

obtain an input distribution of data input values to be received at an analog-in memory computing (AIMC) device combining a plurality of computing elements in a crossbar arrangement to form a neural network model;

select an initial maximum data input value range from said input distribution to be received at the AIMC device;

perform a neural network model operations using quantized input data values mapped from data values within said initial maximum data input value range and obtaining an initial model output value;

determine a performance metric based on said obtained initial model output value; and tune the maximum data input value range to maximize the performance metric, wherein to tune, program instructions further cause the device to clip outlier values of the input distribution of data input values to restrict the input distribution range of data input values and increase a signal to noise (SNR) ratio of a model output value when performing the neural network model operations.

18. The computer program product of claim 17, wherein the device is further caused to:

iteratively modify the maximum data input value range to obtain a higher signal strength for said model, and at each iteration:

perform the neural network model operation using quantized input data values mapped from data values within said modified maximum data input value range and obtaining a further model output value; and determine a corresponding performance metric based on the obtained further model output value; and determine an optimized maximum data input value range corresponding to the model output achieving a best corresponding performance metric.

19. The computer program product as claimed in claim 15, wherein to obtain an input distribution of data input values, the device is further caused to:

add a residual noise value to the obtained initial model output value and add the residual noise value to each further model output obtained during said each iteration, the residual noise value emulating noise introduced into a corresponding hardware neural network model.

20. The computer program product as claimed in claim 15, wherein to iteratively modify the maximum data input value range to obtain a higher signal strength for said model, the device is further caused to: reduce the maximum data input value range at each iteration.

\* \* \* \* \*